(12) United States Patent
Goto et al.

(10) Patent No.: US 9,324,882 B2
(45) Date of Patent: Apr. 26, 2016

(54) THIN FILM TRANSISTOR

(71) Applicants: Kobe Steel, Ltd., Kobe-shi (JP);
Samsung Display Co., Ltd, Yongin (KR)

(72) Inventors: Hiroshi Goto, Kobe (JP); Aya Miki, Kobe (JP); Tomoya Kishi, Kobe (JP); Kenta Hirose, Kobe (JP); Shinya Morita, Kobe (JP); Toshihiro Kugimiya, Kobe (JP); Byung Du Ahn, Hwaseong (KR); Gun Hee Kim, Asan (KR); Yeon Hong Kim, Hwaseong (KR)

(73) Assignees: Kobe Steel, Ltd., Kobe-shi (JP); Samsung Display Co., Ltd., Yongin (KR)

( * ) Notice: Subject to any disclaimer, the term of this patent is extended or adjusted under 35 U.S.C. 154(b) by 0 days.

(21) Appl. No.: 14/721,779

(22) Filed: May 26, 2015

(65) Prior Publication Data
US 2015/0255627 A1 Sep. 10, 2015

Related U.S. Application Data

(63) Continuation of application No. 14/399,378, filed as application No. PCT/JP2013/065743 on Jun. 6, 2013.

(30) Foreign Application Priority Data
Jun. 6, 2012 (JP) .................................. 2012-129399

(51) Int. Cl.
*H01L 29/786* (2006.01)
*H01L 27/12* (2006.01)
(Continued)

(52) U.S. Cl.
CPC .......... *H01L 29/78693* (2013.01); *C23C 14/08* (2013.01); *H01L 21/02554* (2013.01);
(Continued)

(58) Field of Classification Search
None
See application file for complete search history.

(56) References Cited

U.S. PATENT DOCUMENTS 8,558,382 B2    10/2013  Maeda et al.
8,907,334 B2    12/2014  Miki et al.
(Continued)

FOREIGN PATENT DOCUMENTS

JP    2007-63649 A    3/2007
JP    2007-73701      3/2007
(Continued)

OTHER PUBLICATIONS

International Search Report issued Aug. 13, 2013 in PCT/JP2013/065743 filed Jun. 6, 2013 (with English translation).
(Continued)

*Primary Examiner* — Zandra Smith
*Assistant Examiner* — Molly Reida
(74) *Attorney, Agent, or Firm* — Oblon, McClelland, Maier & Neustadt, L.L.P.

(57) ABSTRACT

A thin film transistor containing at least, a gate electrode, a gate insulating film, an oxide semiconductor layer, source-drain electrode and a passivation film, in this order on a substrate. The oxide semiconductor layer is a laminate containing a first oxide semiconductor layer (IGZTO) and a second oxide semiconductor layer (IZTO). The second oxide semiconductor layer is formed on the gate insulating film, and the first oxide semiconductor layer is formed between the second oxide semiconductor layer and the passivation film. The contents of respective metal elements relative to the total amount of all the metal elements other than oxygen in the first oxide semiconductor layer are as follows; Ga: 8% or more and 30% or less; In: 25% or less, excluding 0%; Zn: 35% or more to 65% or less; and Sn: 5% or more to 30% or less.

8 Claims, 5 Drawing Sheets

(51) Int. Cl.
   *H01L 21/02* (2006.01)
   *C23C 14/08* (2006.01)
   *H01L 29/24* (2006.01)

(52) U.S. Cl.
   CPC .... *H01L21/02565* (2013.01); *H01L 21/02631* (2013.01); *H01L 27/1225* (2013.01); *H01L 29/24* (2013.01); *H01L 29/78606* (2013.01); *H01L 29/78696* (2013.01)

(56) References Cited

U.S. PATENT DOCUMENTS

| | | |
|---|---|---|
| 2004/0191530 A1 | 9/2004 | Inoue et al. |
| 2007/0194379 A1 | 8/2007 | Hosono et al. |
| 2009/0197757 A1 | 8/2009 | Fukushima |
| 2009/0278122 A1 | 11/2009 | Hosono et al. |
| 2009/0280600 A1 | 11/2009 | Hosono et al. |
| 2009/0308635 A1 | 12/2009 | Yano et al. |
| 2009/0321732 A1 | 12/2009 | Kim et al. |
| 2010/0155717 A1 | 6/2010 | Yano et al. |
| 2010/0170696 A1 | 7/2010 | Yano et al. |
| 2010/0276685 A1 | 11/2010 | Itagaki et al. |
| 2011/0101352 A1 | 5/2011 | Hosono et al. |
| 2011/0121244 A1 | 5/2011 | Yano et al. |
| 2011/0193083 A1 | 8/2011 | Kim et al. |
| 2011/0201162 A1 | 8/2011 | Hosono et al. |
| 2012/0012838 A1 | 1/2012 | Hosono et al. |
| 2012/0119207 A1 | 5/2012 | Goto et al. |
| 2013/0009111 A1 | 1/2013 | Morita et al. |
| 2013/0119324 A1 | 5/2013 | Morita et al. |
| 2013/0181218 A1 | 7/2013 | Maeda et al. |
| 2013/0228926 A1 | 9/2013 | Maeda et al. |
| 2013/0234081 A1 | 9/2013 | Goto et al. |
| 2013/0240802 A1 | 9/2013 | Miki et al. |
| 2013/0248855 A1 | 9/2013 | Miki et al. |
| 2013/0248858 A1 | 9/2013 | Morita et al. |
| 2013/0270109 A1 | 10/2013 | Morita et al. |
| 2013/0306469 A1 | 11/2013 | Kanamaru et al. |
| 2013/0313110 A1 | 11/2013 | Iwasaki et al. |
| 2013/0334039 A1 | 12/2013 | Goto et al. |
| 2013/0341183 A1 | 12/2013 | Goto et al. |
| 2013/0341617 A1 | 12/2013 | Tao et al. |
| 2014/0054588 A1 | 2/2014 | Maeda et al. |
| 2014/0319512 A1 | 10/2014 | Maeda et al. |

FOREIGN PATENT DOCUMENTS

| | | |
|---|---|---|
| JP | 2008-63214 | 3/2008 |
| JP | 2008-243928 | 10/2008 |
| JP | 2009-164393 | 7/2009 |
| JP | 2010-16347 | 1/2010 |
| JP | 2010-21333 | 1/2010 |
| JP | 2010-40552 | 2/2010 |
| JP | 4568828 B2 | 10/2010 |
| JP | 2011-187506 | 9/2011 |
| JP | 2012-26039 | 2/2012 |
| KR | 2011-0100580 | 9/2011 |
| WO | WO 03/008661 | 1/2003 |
| WO | WO 2007/937191 | 4/2007 |

OTHER PUBLICATIONS

Solid Physics, vol. 44, p. 621, No. 9, 2009 7 pages, (equivalent of reference AX by Kenji Nomura, et al. "Amorphous . . . ").

Kenji Nomura, et al., "Amorphous Oxide Semiconductors for High-Performance Flexible Thin-Film Transistors", Japanese Journal of Applied Physics, vol. 45, No, 5B, 2006, pp. 4303-4308.

Jaechul Park, et al., "High-performance amorphous gallium indium zinc oxide thin-film transistors through $N_2O$ plasma passivation", Applied Physics Leiters 93, 053505, 2008, 2 pages.

Kenji Nomura, et al., "Room-temperature fabrication of transparent flexible thin-film transistors using amorphous oxide semiconductors", Letters to Nature, Nature, vol. 432, Nov. 2004, 5 pages.

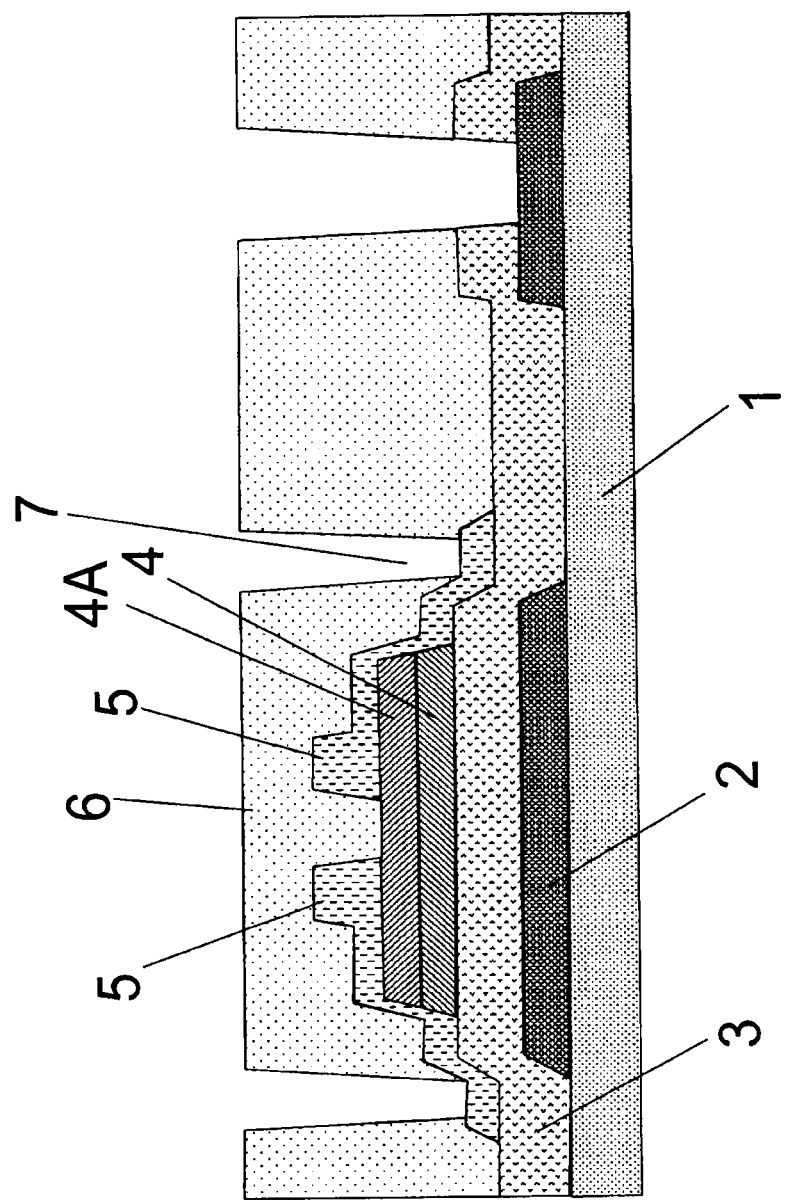

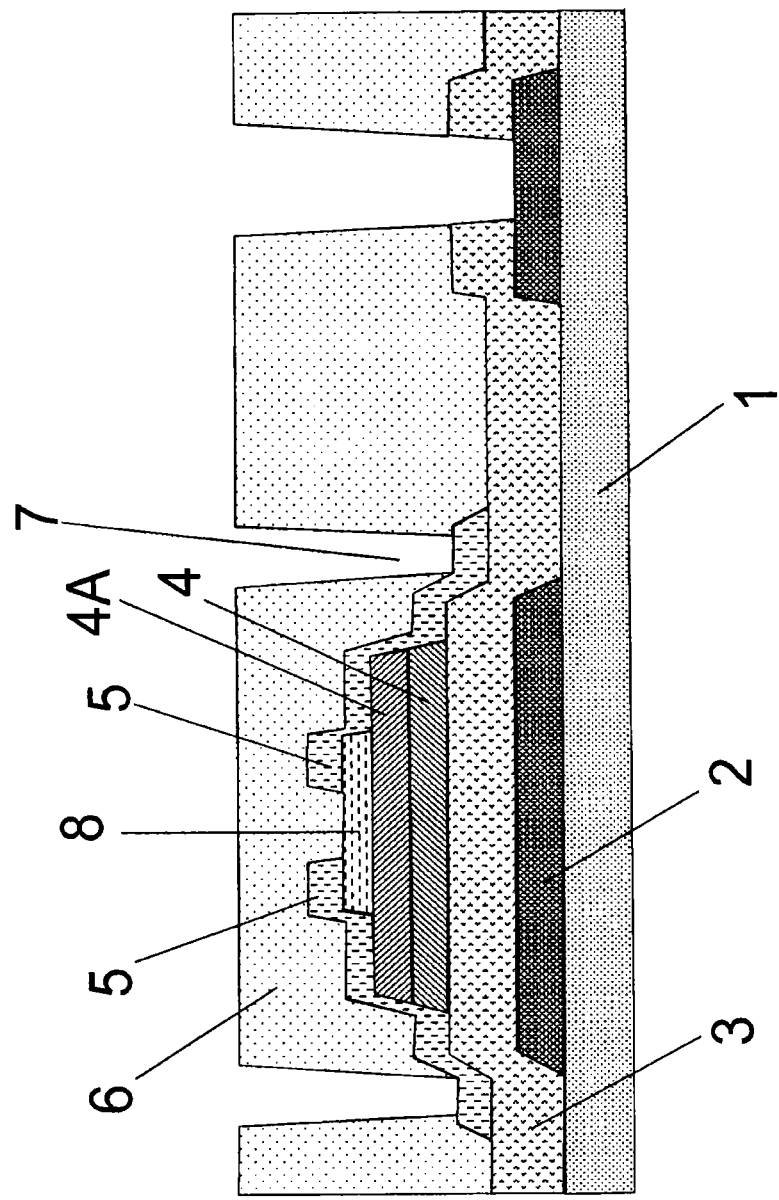

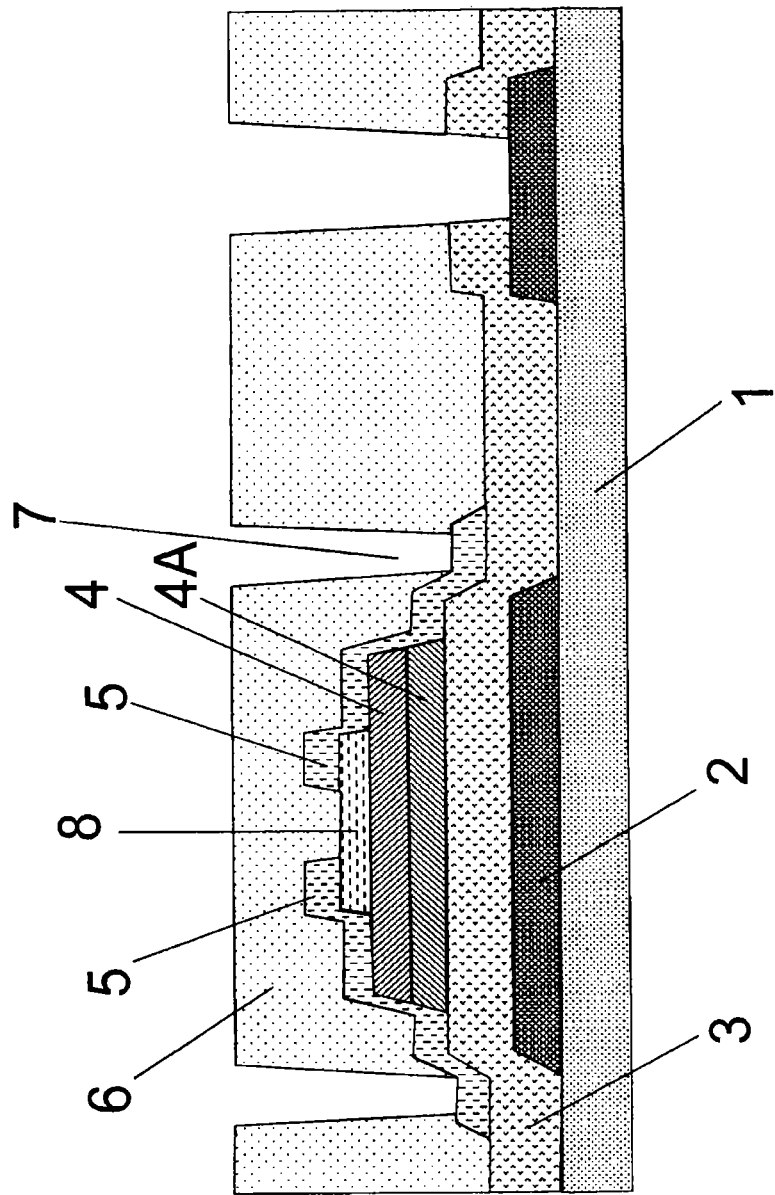

THIN FILM TRANSISTOR

CROSS REFERENCE TO RELATED APPLICATION(S)

This application is a continuation of U.S. application Ser. No. 14/399,378, filed on Nov. 6, 2014, which is a 35 U.S.C. 371 national stage patent application of international patent application PCT/JP2013/065743, filed on Jun. 6, 2013, the text of which is incorporated by reference, and claims foreign priority to JP 2012-129399 filed on Jun. 6, 2012, the entire content of which is incorporated herein by reference.

TECHNICAL FIELD

The present invention is related to a thin film transistor (TFT) to be used in display devices such as a liquid crystal display and an organic EL display.

BACKGROUND ART

As compared with widely used amorphous silicon (a-Si), amorphous (non-crystalline) oxide semiconductors have high carrier mobility (also called as field-effect mobility, which may hereinafter be referred to simply as "mobility"), wide optical band gaps, and film formability at low temperatures, and therefore, have highly been expected to be applied for next generation displays, which are required to have large sizes, high resolution, and high-speed drives; and to resin substrates having low heat resistance; and others.

When an oxide semiconductor is used for a semiconductor layer of a thin film transistor, the oxide semiconductor is required to have a high carrier concentration (mobility) and excellent TFT switching characteristics (transistor characteristics or TFT characteristics). More specifically, the oxide semiconductor is required to have, for example, (1) a high on-state current (i.e., the maximum drain current when a positive voltage is applied to both a gate electrode and a drain electrode); (2) a low off-state current (i.e., a drain current when a negative voltage is applied to the gate electrode and a positive voltage is applied to the drain voltage, respectively); (3) a low S value (sub-threshold swing, i.e., a gate voltage needed to increase the drain current by one digit); (4) a stable threshold value (i.e., a voltage at which the drain current starts to flow when a positive voltage is applied to the drain electrode and either a positive voltage or a negative voltage is applied to the gate voltage, which voltage may also be called as a threshold voltage) showing no change with time (which means that the threshold voltage is uniform in the substrate surface); and (5) a high mobility.

An amorphous oxide semiconductor consisting of indium, gallium, zinc, and oxygen (In—Ga—Zn—O, occasionally referred to as "IGZO" hereinbelow) is widely used as it possesses these properties (see Patent Document 1, Non-patent Literature Document 1, and Non-patent Literature Document 2).

An amorphous oxide semiconductor consisting of indium, zinc, tin, and oxygen (In—Zn—Sn—O, occasionally referred to as "IZTO" hereinbelow) is also used as a material having higher mobility than IGZO (see Patent Document 2).

PRIOR ART DOCUMENTS

Patent Document

Patent Document 1: Japanese Patent No. 4568828
Patent Document 2: Japanese Patent Laid-open Publication No. 2008-243928

Non-Patent Literature Document

Non-patent Literature Document 1: Kotaibutsuri (Solid State Physics), Vol. 44, p. 621 (2009)

Non-patent Literature Document 2: Nature, Vol. 432, p. 488 (2004)

SUMMARY OF THE INVENTION

Problems to be Solved by the Invention

Thin film transistors using the oxide semiconductor layers are required to have excellent resistance to stresses such as voltage application and light irradiation (a small variation in the threshold voltage before and after applying the stresses). It is pointed out that, for example, when a voltage is continuously applied to the gate electrode or when light in a blue emitting band in which light absorption rises up is continuously irradiated, charges are trapped on the boundary between the gate insulating film and the semiconductor layer of a thin film transistor, resulting in a variation of switching characteristics, such as a shift of the threshold voltage. In addition, for example, when a liquid crystal panel is driven or when a negative bias is applied to the gate electrode to turn on a pixel, the TFT is irradiated with light leaked out from the liquid crystal cell, and this light gives stress to the TFT to cause deterioration in the characteristics. Indeed, when a thin film transistor is used, a variation of switching characteristics due to stress by voltage application causes a lowering of reliability in a display devices itself, such as a liquid crystal display or an organic EL display.

Similarly in an organic EL display panel, the semiconductor layer is irradiated with light leaked out from a light emission layer, and this light gives stress to the TFT to cause deterioration in the characteristics such as a variation of threshold voltage.

Such a shift of threshold voltage of TFT deteriorates the reliability of display devices such as a liquid crystal display and an organic EL display. Therefore, an improvement in the stress resistance is eagerly desired.

Further, in the course of fabrication process of a thin film transistor substrate having the oxide semiconductor thin film and source-drain electrode on top of the thin film, the oxide semiconductor is further required to have high resistance to a wet etchant. Since different kinds of wet etchants are used in each processing steps of a TFT, the oxide semiconductor is specifically required to possess the following two characteristics.

(A) Excellent solubility into a wet etchant solution for processing the oxide semiconductor It is required for the oxide semiconductor to be etched at an appropriate rate by an organic acid-based wet etchant such as oxalic acid which are used in processing oxide semiconductor films so that the oxide semiconductor is patterned without a residue.

(B) Insolubility into a wet etchant for the source-drain electrode

A source electrode and a drain electrode formed on top of the oxide semiconductor film are etched at an appropriate rate by an inorganic-based wet etchant including such as for example phosphoric acid, nitric acid, and acetic acid, used for processing the source and drain electrode interconnection films. It is required for a surface (a side of back channel) of the oxide semiconductor film not to be etched or damaged by the wet etchant so that the oxide semiconductor is not deteriorated in terms of the TFT characteristics and stress resistance.

While degree of etching (etching rate) is generally dependent of kind of wet etchant, the IZTO shows an excellent solubility to wet etchant such as oxalic acid, i.e., excellent in adaptability to wet etching process of the oxide semiconductor layer. The oxide semiconductor, however, also shows high solubility into inorganic acid-based wet etchants, and is extremely easily etched by the inorganic acid-based wet etchant solutions. If the IZTO film is dissolved in the wet etching process of the source-drain electrode, fabrication of TFT then becomes difficult, and the TFT characteristics are deteriorated. In other words, IZTO is inferior in terms of (B) the durability in a wet etchant for the source-drain electrode. In an attempt to solve the problem, use of an etchant (a mixed solution of $NH_4F$ and $H_2O_2$) which does not etch IZTO is under consideration. However, the wet etchant is unstable and shows a short life-time, and deteriorates the productivity.

The deterioration of TFT characteristics accompanying a wet etching of source-drain electrode in case (B) may be particularly observed in a TFT of back channel etch (BCE) structure without an etch stopper layer as shown in FIG. 1.

There are two types in thin film transistors of bottom-gate structure comprising an oxide semiconductor; one is a back channel etch (BCE) type without an etch stopper layer as shown in FIG. 1, while the other is an etch stop (ESL) type with an etch stopper layer 8 as shown in FIG. 2.

The etch stopper layer 8 shown in FIG. 2 is formed for the purpose of preventing deterioration of TFT characteristics by damaging the oxide semiconductor layer 4 in the course of etching the source-drain electrode 5. Excellent TFT characteristics is likely to be secured by the structure shown in FIG. 2 as it reduces damages on the surface of oxide semiconductor layer in the course of fabricating a source-drain electrode. An insulating film such as $SiO_2$ is usually used for the etch stopper layer.

The TFT shown in FIG. 1, on the other hand, is suited to simplify fabrication process because of absence of an etch stopper layer, and is thus superior in terms of productivity. It is possible to avoid damaging the oxide semiconductor layer 4 during the etching step even without the etch stopper layer by appropriately designing fabrication process. For example, an etch stopper layer is not necessary when fabricating a source-drain electrode by a lift-off method, as the oxide semiconductor layer 4 is not damaged. In such a case a BCE-type transistor as shown in FIG. 1 is adopted. The BCE-type transistor structure shown in FIG. 1 may also be employed when a wet etching solution that is particularly developed to secure excellent TFT characteristics without an etch stopper layer is used in the fabrication process.

From the point of view of reducing fabrication cost and simplifying the process it is recommended as described above to adopt a BCE-type transistor which does not require an etch stopper layer as illustrated in FIG. 1. However, the aforementioned issue regarding wet etching is strongly concerned. On the other hand, even in an ESL-type transistor shown in FIG. 2, the aforementioned issue may arise depending on kind of etch etchant solution used in the fabrication process.

The present invention has been made under the circumstances described above, and one object of the present invention is to provide a BCE-type thin film transistor, without an etch stopper layer, comprising an oxide for a semiconductor layer having; high field-effect mobility; excellent resistance to stresses such as voltage application and light irradiation, which is represented by a small variation in the threshold voltage before and after applying the stresses; a superior solubility into a wet etchant for processing an oxide semiconductor; and an excellent resistance to a wet etchant for fabricating a source-drain electrode.

Another object of the present invention is to provide an ESL-type thin film transistor, with an etch stopper layer, comprising an oxide for a semiconductor layer having; high field-effect mobility; excellent stress resistance; and superior solubility into a wet etchant for processing an oxide semiconductor.

Means for Solving the Problems

One thin film transistor of the present invention, which can solve the above-mentioned problems, is comprising at least; a gate electrode, a gate insulating film, an oxide semiconductor layer, source-drain electrode, and a passivation film to protect the source-drain electrode, on a substrate in this order, in which the oxide semiconductor layer is a laminate comprising: a first oxide semiconductor layer consisting of In, Ga, Zn, Sn, and O; and a second oxide semiconductor layer consisting of In, Zn, Sn and O. The second oxide semiconductor layer is formed on the gate insulating film, and the first oxide semiconductor layer is formed between the second oxide semiconductor layer and the passivation film. The contents (in atomic %, the same hereinafter) of respective metal elements relative to the total amount of all the metal elements other than oxygen in the first oxide semiconductor layer are; In: smaller than or equal to 25% (excluding 0%); Ga: larger than or equal to 5%; Zn: larger than or equal to 35.0% and smaller than or equal to 65.0%; Sn: larger than or equal to 8% and smaller than or equal to 30%.

The contents of respective metal elements relative to the total amount of all the metal elements other than oxygen in the first oxide semiconductor layer are preferably; In: smaller than or equal to 20% (excluding 0%); Ga: larger than or equal to 15% and smaller than 50%; Zn: larger than or equal to 35% and smaller than or equal to 65%; and Sn: larger than or equal to 8% and smaller than or equal to 30%.

Etching rate of the first oxide semiconductor layer to a wet etchant for source-drain electrode is preferably smaller than or equal to one half of etching rate of the source-drain electrode.

Another thin film transistor of the present invention is comprising at least; a gate electrode, a gate insulating film, an oxide semiconductor layer, source-drain electrode, an etch stopper layer, and a passivation film to protect the source-drain electrode, on a substrate in this order, in which the oxide semiconductor layer is a laminate structure having a first oxide semiconductor layer consisting of In, Ga, Zn, Sn, and O; and a second oxide semiconductor layer consisting of In, Zn, Sn and O. The contents (in atomic %, the same hereinafter) of respective metal elements relative to the total amount of all the metal elements other than oxygen in the first oxide semiconductor layer are; In: smaller than or equal to 25% (excluding 0%); Ga: larger than or equal to 8.0%; Zn: larger than or equal to 30.0% and smaller than or equal to 65%; and Sn: larger than or equal to 5% and smaller than or equal to 30%.

The contents of respective metal elements relative to the total amount of all the metal elements other than oxygen in the first oxide semiconductor layer are; In: smaller than or equal to 20% (excluding 0%); Ga: larger than or equal to 15% and smaller than 50%; Zn: larger than or equal to 35% and smaller than or equal to 65%; and Sn: larger than or equal to 8% and smaller than or equal to 30%.

The second oxide semiconductor layer is preferably formed on the gate insulating film; and the first oxide semiconductor layer is preferably formed between the second oxide semiconductor layer and the etch stopper layer.

Further, the thickness of the second oxide semiconductor layer is preferably greater than or equal to 0.5 nm.

The present invention further encompasses a display device having the thin film transistors as described above.

Effects of the Invention

The present invention can provide a BCE-type thin film transistor having, without an etch stopper layer, an oxide for semiconductor which is excellent in terms of switching characteristics, stress resistance demonstrated by a small variation of threshold voltage before and after the stress biasing, in addition to high carrier mobility. The oxide for semiconductor is also excellent with respect to wet etching properties including (A) a superior solubility to a wet etchant solution for an oxide semiconductor (adaptability to wet etching process) and (B) superior resistance to a wet etchant solution for a source-drain electrode (durability in wet etching).

The present invention can also provide an ESL-type thin film transistor having, with an etch stopper layer, an oxide for semiconductor which is excellent in terms of switching characteristics, stress resistance demonstrated by a small variation of threshold voltage before and after the stress biasing, in addition to high carrier mobility. The oxide for semiconductor is also excellent with respect to wet etching properties including (A) a superior solubility to a wet etchant solution for an oxide semiconductor (adaptability to wet etching process).

BRIEF DESCRIPTION OF DRAWINGS

FIG. 3 is a schematic cross-sectional view for explaining an embodiment of a BCE-type thin film transistor comprising a laminate structure of a second oxide semiconductor layer on the near side of the substrate and a first oxide semiconductor layer on the far side of the substrate.

FIG. 4 is a schematic cross-sectional view for explaining an embodiment of an ESL-type thin film transistor comprising a laminate structure of a second oxide semiconductor layer on the near side of the substrate and a first oxide semiconductor layer on the far side of the substrate.

FIG. 5 is a schematic cross-sectional view for explaining an embodiment of an ESL-type thin film transistor comprising a laminate structure of a second oxide semiconductor layer on the far side of the substrate and a first oxide semiconductor layer on the near side of the substrate.

MODE FOR CARRYING OUT THE INVENTION

Figure 1:
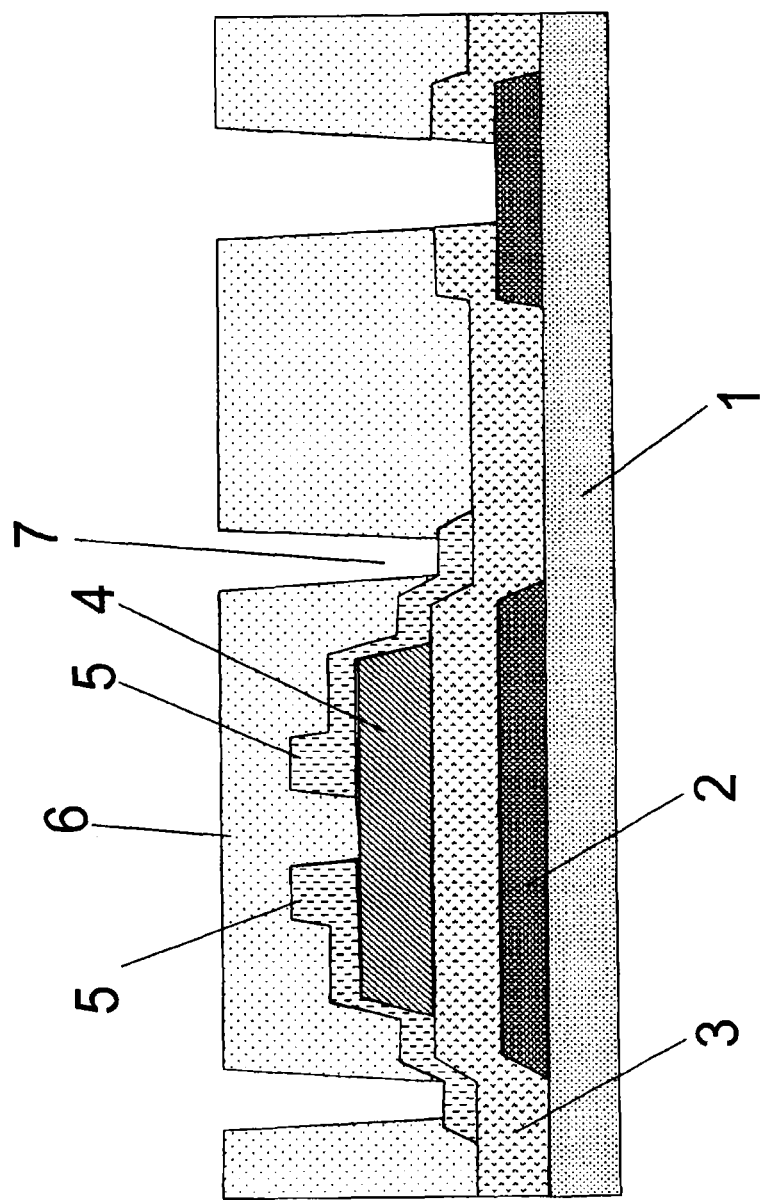
FIG. 1 is a schematic cross-sectional view for explaining an embodiment of a BCE-type thin film transistor comprising a conventional oxide semiconductor single layer.

The present inventors completed the invention by finding that the desired object is accomplished by forming a laminate structure of oxide semiconductor layer consisting of IZTO (occasionally referred to as "second oxide semiconductor layer") and an oxide comprising In, Ga, Zn, Sn, and O (occasionally referred to as "IGZTO" hereinbelow) of predetermined range of chemical compositions (occasionally referred to as "first oxide semiconductor layer" hereinbelow).

In the present specification, the wording "excellent in stress resistance" means that the threshold voltage shift (the absolute value of $\Delta V_{th}$) is smaller than that of IZTO single layer, after an stress biasing test conducted under a condition described below in Examples. Specifically, the stress biasing test was conducted for 2 hours by continuously applying negative bias onto the gate electrode under white light irradiation.

In the present specification, the wording "excellent in wet etching property" means that the oxide semiconductor layer is both (A) excellent in adaptability to wet etching process and (B) excellent in durability in wet etching as described below if the transistor is a BCE type without an etch stopper layer. If the transistor is an ESL-type with an etch stopper layer, the wording "excellent in wet etching property" means that the oxide semiconductor layer is (A) excellent in the adaptability to wet etching process as explained below. It is noted here that the adaptability to wet etching process and the durability in wet etching are collectively referred to "wet etching property" occasionally hereinbelow.

(A) Excellent in adaptability to wet etching process means that the oxide semiconductor layer shows an excellent solubility into a wet etchant solution for oxide semiconductors. This means that the first and second oxide semiconductor layers constituting the laminate structure of the present invention are patterned by etching in roughly similar manner within a difference of 0.1 to 4 times in etching rates without forming etching residues in an organic acid-based wet etchant solution such as oxalic acid which is used for fabricating oxide semiconductor films.

(B) Excellent in durability in wet etching means that a source-drain electrode is etched and that an oxide semiconductor layer is not soluble to the wet etching solution for the source-drain electrode. In the present specifications, for the purpose of simplifying measurements, etching rate is measured by subjecting each of the oxide semiconductor films deposited on a substrate to a wet etchant solution for a source-drain electrode, as explained below in Examples. If measured etching rate for the first oxide semiconductor layer is smaller than or equal to one half of that of the source-drain electrode, then the oxide semiconductor layer is evaluated excellent in durability in the wet etchant solution for the source-drain electrode. Oxide semiconductor layers having etching rate in the range is so resistive to the etchant solution that deterioration of TFT characteristics and stress resistance is not likely to occur by damaging or etching of the surface (the side of back-channel) of the oxide semiconductor layer in the wet etchant solution.

Hereinbelow, the present invention is described in detail including the background of the invention.

As described above, IZTO is widely used for an oxide semiconductor layer having a high mobility. Although IZTO has higher mobility than IGZO, the stress resistance is inferior to IGZO, which is liable to deteriorate the stability. Higher stress resistance is necessary to correspond to requirements for larger size and high-speed drive of display devices, accordingly.

The present inventors have made intensive studies in order to improve the stress resistance of IZTO which is useful for an oxide semiconductor layer.

It was found as a result of the studies that trapping level arising from oxygen deficiency are liable to be generated at the heterointerface between IZTO and insulating films such as $SiO_2$, $Al_2O_3$, and $HfO_2$, which may hereinafter be collectively referred to as "oxide-based insulator", for a passivation film in a BCE-type transistor or an etch stopper layer in an ESL-type transistor.

The oxide semiconductor layer is made to a laminate of first and second oxide semiconductor layers in the present invention, accordingly. Specifically, the first oxide semiconductor layer consisting of IGZTO is interposed between the second oxide semiconductor layer consisting of IZTO and the oxide-based insulator.

In other words, the first oxide semiconductor layer was formed as a protective layer for the second oxide semiconductor layer between the oxide-based insulator and the second oxide semiconductor layer. By making the second oxide semiconductor layer away from directly contacting to the oxide-based insulator, the generation of trapping level arising from oxygen deficiency can be suppressed.

Strictly speaking, the first and the second oxide semiconductor layers are different from each other in terms of the presence/absence of Ga. Their constituting elements other than Ga are, however, overlapping with each other. Therefore, by appropriately controlling the ratio of the elements constituting the first oxide semiconductor layer, the formation of the trapping level can be suppressed at the interface between the first and the second oxide semiconductor layers. It is inferred that the interface structure of the second oxide semiconductor is hence stabilized, resulting in improvement of the stress resistance while securing the high mobility.

It is also noted here that the TFT characteristics such as mobility in the oxide semiconductor layer as a whole shows little degradation in the present invention not only because the first oxide semiconductor layer is not liable to generate oxygen deficiency at the interface with the oxide-based insulator but also because the second oxide semiconductor layer sufficiently secures high mobility in the oxide semiconductor layer as a whole.

Further, wet etching property of the oxide semiconductor layer was improved by the laminate structure of the present invention. The oxide semiconductor layers of BCE- and ESL-types according to the present invention are excellent in adaptability to wet etching process including the superior solubility to a wet etchant solution for an oxide semiconductor. A laminate structure of oxide semiconductor layers oftentimes causes a problem such that a desired pattern and profile cannot be obtained in the course of patterning interconnections, because of difference in etching rates between the first and second oxide semiconductor layers arising from difference in kinds and amounts of contained metal elements. In the present invention, however, it is possible to adjust the etching rates of the first and second oxide semiconductor layers similar to each other by appropriately controlling the chemical compositions and the ratio of the metals in the oxide layers.

The first oxide semiconductor layer in a BCE-type transistor of the present invention is (B) excellent in durability in wet etching, showing high insolubility to a wet etchant solution for a source-drain electrode. As the first oxide semiconductor layer is resistive to inorganic acid-based wet etchant solutions, it is unlikely that the surface of the back channel side of the oxide semiconductor layer is etched by the wet etchant or the TFT characteristics are deteriorated.

A preferred amount of each of the metal elements (In, Ga, Zn, and Sn) constituting the first oxide semiconductor layer (respective ratio of each metal in all the metal elements constituting the first oxide semiconductor layer except for oxygen) may be determined by considering the kinds, chemical composition, mobility, carrier density and wet etching property of the second oxide semiconductor layer.

In of smaller than or equal to 25% (excluding 0%) in both BCE- and ESL-types of transistors:

In is an element effective to reduce electrical resistance of an oxide semiconductor layer. In order to effectively exert the effect, In is to be contained in an amount of preferably 1% or more, more preferably 3% or more, and even more preferably 5% or more in both BCE- and ESL-types of transistors. On the other hand, if the contained amount of In is excessively large, there may be a case in which stress resistance of a transistor is deteriorated. In is thus to be contained in an amount of preferably 25% or less, more preferably 23% or less, and even more preferably 20% or less in the first oxide semiconductor layer for both BCE- and ESL-types of transistors.

Ga of larger than or equal to 5% in BCE-type transistor which is not comprising an etch stopper layer, and larger than or equal to 8.0% in ESL-type transistor Comprising an Etch Stopper Layer:

Ga is an element effective to suppress generation of oxygen deficiency and improve stress resistance of an oxide semiconductor layer. In order to effectively exert the effect, Ga is to be contained in an amount of preferably 5% or more, more preferably 10% or more, and even more preferably 15% or more in a BCE-type transistor which does not comprise an etch stopper layer. On the other hand, the amount of Ga is to be 8.0% or more, preferably 10% or more, more preferably 12% or more, and even more preferably 15% or more in an ESL-type transistor having an etch stopper layer. If the contained amount of Ga is excessively large, a sputtering target to deposit the first oxide semiconductor layer becomes highly electrically resistive. Use of such a sputtering target with such high amount of Ga for film deposition could possibly prevent normal DC (direct current) discharge. It is thus preferable to control the amount of Ga to less than 50% in the sputtering target. Further, there may be a case in which mobility is decreased due to relative decrease of In and Sn which play a role of conduction path for electrons in the transistor. Ga is thus to be contained in an amount of preferably 40% or less, more preferably 30% or less, and even more preferably 20% or less.

Zn of 35 to 65% in BCE-type transistor without an etch stopper layer, and 30.0 to 65% in ESL-type transistor with an etch stopper layer:

Zn is an element which influences wet etching rate. Insufficient amount of Zn deteriorates the adaptability to wet etching process in a wet etchant solution for an oxide semiconductor. Insufficient amount of Zn also makes amorphous structure of the oxide semiconductor unstable, and occasionally hinders the switching operation of TFTs. Zn is to be contained in an amount of preferably 35% or more, more preferably 40% or more, and even more preferably 45% or more in the BCE type of transistor, accordingly. In the ESL-type of transistors, Zn is to be contained in an amount of preferably 30.0% or more, more preferably 35% or more, and even more preferably 40% or more If the contained amount of Zn is excessively large, on the other hand, etching rate of such oxide semiconductors excessively increases in wet etchant solutions for processing oxide semiconductors, which makes patterning the oxide semiconductor layers into a desired shape difficult. Further, there may be a case in which the oxide semiconductor thin film is crystallized or the stress resistance is deteriorated due to relative decrease of In and Sn. Zn is thus to be contained in an amount of preferably 65% or less, and more preferably 60% or less.

Sn of 8 to 30% in BCE-type transistor without an etch stopper layer, and 5 to 30% in ESL-type transistor with an etch stopper layer:

Sn is an element effective to improve the mobility and the durability in wet etching of the oxide semiconductor layer. Insufficient amount of Sn deteriorates the stress resistance and increase the wet etching rate to a wet etchant solution for the source-drain electrode, which causes decrease in thickness of and damages on the surface of the oxide semiconductor layers, resulting in deterioration of the TFT characteristics. In addition, insufficient amount of Sn could deteriorate the adaptability to wet etching process in a wet etchant solution for the oxide semiconductor. Sn is thus to be contained in an amount of preferably 8% or more, more preferably 10% or more, and even more preferably 12% or more in a BCE-type transistor. On the other hand, the amount of Sn is preferably 5% or more, more preferably 8% or more, and even more preferably 10% or more in an ESL-type transistor. If the contained amount of Sn is excessively large, there may be a case in which the stress resistance is deteriorated and the etching rate to a wet etchant solution for the oxide semiconductor is decreased, meaning that the wet etching characteristic is deteriorated. In particular, excessive Sn makes the oxide semiconductor insoluble to organic acids such as oxalic acid or the like which are widely used as wet etching solutions for the oxide semiconductors, resulting in an inability to process the oxide semiconductor layers. Sn is thus to be contained in an amount of preferably 30% or less, more preferably 28% or less, and even more preferably 25% or less in a BCE-type transistor which does not comprise an etch stopper layer. On the other hand, the amount of Sn is to be 30% or less, preferably 25% or less, more preferably 23% or less, and even more preferably 20% or less in an ESL-type transistor having an etch stopper layer.

It is preferable to specify and control an appropriate range of chemical composition in the first oxide semiconductor by considering proper balance of each of the elements so that the desired properties and characteristics are effectively obtained in both BCE- and ESL-types of transistors.

Respective ratio of the metals (In, Zn, and Sn) constituting the second oxide semiconductor layer of the present invention is not particularly limited as long as oxides containing these metals comprise an amorphous phase and show semiconductor properties. However, as explained above, the mobility and the wet etching property are deteriorated depending on the amount (atomic %) of each metal contained in the oxide semiconductor layers. Respective ratio of the metals is thus to be appropriately controlled. For example, it is desirable that the etching rates are roughly the same for the first and second semiconductor layers in wet etching processes. The chemical composition of the oxide semiconductor layers may be thus adjusted so that the etching rates are roughly the same (the ratio of the etching rates is in a range from 0.1 to 4).

Thickness of the second oxide semiconductor layer is not particularly limited in either BCE- or ESL-type of TFT in the present invention. However, if the second oxide semiconductor layer is too thin, then undesirable deviation (or distribution) is liable to arise of the in-plane characteristics of the substrate (TFT characteristics such as mobility, S value, and $V_{th}$). The thickness of the second oxide semiconductor layer is thus preferably controlled to greater than or equal to 0.5 nm, and more preferably greater than or equal to 5 nm, and even more preferably greater than or equal to 10 nm, from the view point of suppressing the undesirable deviation of the TFT characteristics. On the other hand, if the second oxide semiconductor layer is too thick, microfabrication property of the oxide semiconductor layer is liable to be deteriorated, and it takes prolonged period of time to deposit and etch the layer, causing the increase of the production cost. The thickness of the second oxide semiconductor layer is preferably smaller than or equal to 100 nm, and more preferably smaller than or equal to 50 nm, accordingly. The thickness of the second oxide semiconductor layer may be smaller than or equal to 30 nm, preferably smaller than or equal to 20 nm, and even smaller than or equal to 10 nm in order to be the same as or smaller than that of the first oxide semiconductor layer.

Thickness of the first oxide semiconductor layer is not particularly limited in either BCE- or ESL-type of TFT. However, if the first oxide semiconductor layer is too thin, then the effect of forming the first oxide semiconductor layer may not be sufficiently exerted. The thickness of the first oxide semiconductor layer is thus preferably greater than or equal to 20 nm, and more preferably greater than or equal to 30 nm. On the other hand, if the first oxide semiconductor layer is too thick, the mobility is liable to decrease. The thickness of the first oxide semiconductor layer in both types of TFT is thus preferably smaller than or equal to 50 nm, and more preferably smaller than or equal to 40 nm.

Total thickness of the oxide semiconductor layer consisting of the second oxide semiconductor layer and the first oxide semiconductor layer may be appropriately combined as long as each thickness of the second and the first layers is controlled within the ranges described above in both BCE- and ESL-types of transistors. However, excessively thick total thickness increases the production cost and hinders reducing the thickness of thin film transistors. The total thickness is thus preferably smaller than or equal to 100 nm, and more preferably smaller than or equal to 50 nm. The lower limit of total thickness may not be particularly specified as long as the effects of each of the oxide semiconductor layers can be exerted.

Explained next in the following are preferred embodiments of the laminate structure of the first oxide semiconductor layer (IGZTO) and the second oxide semiconductor layer (IZTO) in the present invention.

Figure 2:
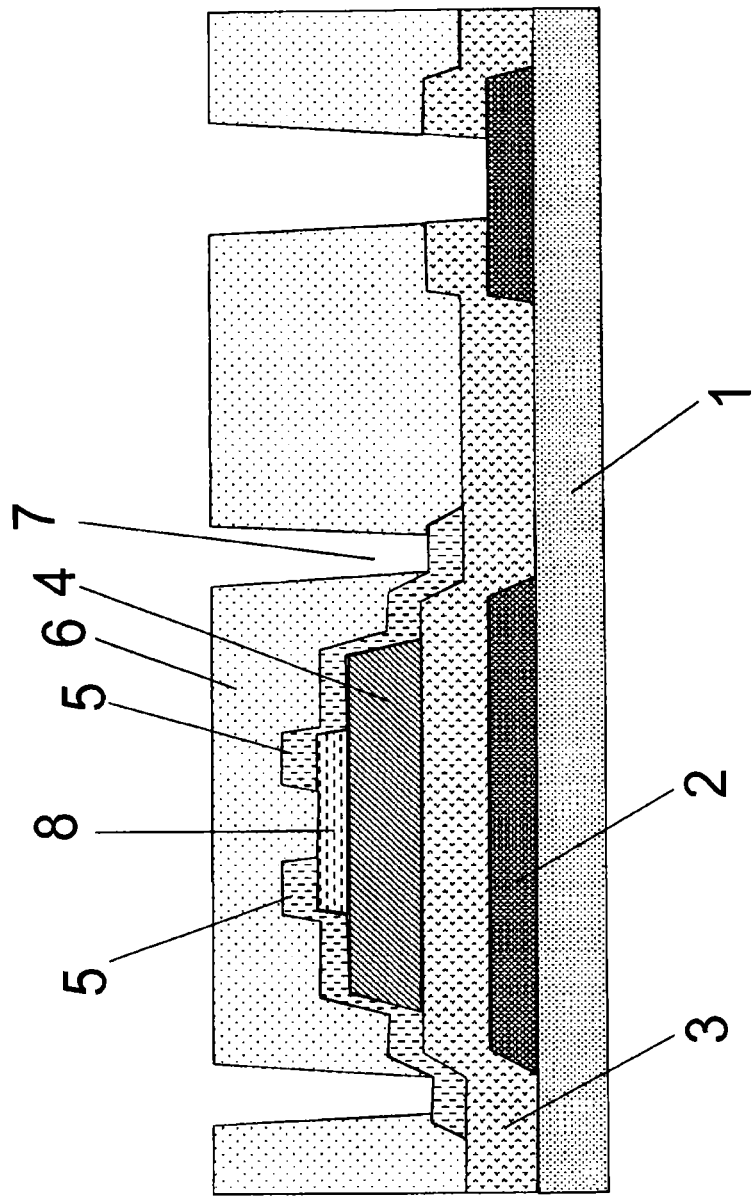
FIG. 2 is a schematic cross-sectional view for explaining an embodiment of an ESL-type thin film transistor comprising a conventional oxide semiconductor single layer.

Firstly in a conventional example, single layer of the second oxide semiconductor consisting of IZTO 4 is in direct contact with a passivation film 6 and a gate insulating film 3 as shown in FIG. 1 which illustrates a BCE-type transistor without an etch stopper layer, or with an etch stopper layer 8 and a gate insulating film 3 as shown in FIG. 2 which illustrates an ESL-type transistor with an etch stopper layer.

FIG. 3 shows an example of the preferred embodiment of a BCE-type transistor of the present invention. As the second oxide semiconductor layer 4 (IZTO) is liable to form trap levels due to oxygen deficiency at the interface with a passivation film 6, the first oxide semiconductor layer 4A (IGZTO) is formed between the second oxide semiconductor layer (IZTO) and the passivation film 6. The issue of oxygen deficiency is circumvented by the structure which also protects the second oxide semiconductor layer from a wet etchant for source-drain electrode.

While the first oxide semiconductor layer 4A is configured to be in direct contact to the passivation film 6 in the illustrated example, another layer may be interposed between the first oxide semiconductor layer 4A and the passivation film 6.

FIG. 4 shows another example of the preferred embodiment of an ESL-type transistor of the present invention. A first oxide semiconductor layer 4A is formed between a second oxide semiconductor layer 4 and an etch stopper layer 8. While the first oxide semiconductor layer 4A is configured to be in direct contact to the etch stopper layer 8 in the illustrated example, another layer may be interposed between the first oxide semiconductor layer 4A and the etch stopper layer 8. The second oxide semiconductor layer 4 (IZTO) is liable to form trap levels due to oxygen deficiency at the interface with the etch stopper layer 8. To circumvent the problem, the first oxide semiconductor layer 4A (IGZTO) is formed between the second oxide semiconductor layer (IZTO) and the etch stopper layer 8. Further, high channel mobility can be secured by configuring the second oxide semiconductor layer 4 having high mobility on the side of gate insulating film 3, where more current goes through, instead of on the side of the etch stopper layer 8.

FIG. 5 depicts another example of the preferred embodiment of an ESL-type transistor of the present invention, having a reverse order of the first and second oxide semiconductor layers from the laminate structure shown in FIG. 4. A first oxide semiconductor layer 4A is formed between a second oxide semiconductor layer 4 and a gate insulating film 3. While the first oxide semiconductor layer 4A is configured to be in direct contact to the gate insulating film 3 in the illustrated example, another layer may be interposed therebetween as for the cases described above. Even in the reversed order of the first and second oxide semiconductor layers in the laminated structure, the oxygen deficiency at the interface can be suppressed. Further, high channel mobility can be secured even by configuring the second oxide semiconductor layer on the side of etch stopper layer as long as the second oxide semiconductor layer is IZTO without Ga which affects to the mobility.

The effect of improving the stress resistance can be secured by forming a first oxide semiconductor layer 4A between the second oxide semiconductor layer 4 and at least one of the gate insulating film 3 and the etch stopper layer 8 (preferably etch stopper layer as explained below) in the ESL structure.

Next, methods for forming the oxide semiconductor layers of the present invention is explained.

The second oxide semiconductor layer consisting of IZTO and the first oxide semiconductor layer consisting of IGZTO may preferably be formed by a sputtering method using a sputtering target (which may hereinafter be referred to as the "target"). The sputtering method requires no great effort to form a thin film having excellent uniformity in terms of composition or film thickness in the film surface. The oxide can also be formed by a chemical film-formation method such as a coating method.

As a target to be used in the sputtering method, there may preferably be used a sputtering target containing the elements described above and having the same composition as that of a desired oxide, thereby making it possible to form a thin film showing small deviation of composition and having the same composition as that of the desired oxide. Specifically, as the target for depositing the second oxide semiconductor layer (IZTO), an oxide target consisting of In, Zn, and Sn can be used.

As the target for forming the first oxide semiconductor layer (IGZTO), an oxide target consisting of In, Ga, Zn, and Sn can be used.

Alternatively, the formation of a film may also be carried out by a co-sputtering method in which two targets having different compositions are simultaneously discharged. Further alternatively, a target of a mixture including more than one kind of the elements can be used.

Each of the targets as described above can be produced, for example, by a powder sintering method.

The second and the first oxide semiconductor layers may preferably be formed successively, while keeping under vacuum, by the sputtering method. This is because exposure to air in the formation of the oxide semiconductor layers leads to the attachment of water or organic substances in the air to the thin film surface, which leads to the contamination (quality failure).

When depositing a film of such an oxide using the sputtering target, the sputtering conditions may preferably be controlled in an appropriate manner, such as gas pressure, amount of oxygen (partial pressure of oxygen), input power to be applied to a sputtering target, substrate temperature, and T-S distance (the distance between the sputtering target and the substrate) in order to increase the density of the oxide semiconductor layers as large as possible, preferably to larger than or equal to 6.0 g/cm$^3$, by compensating oxygen that desorbs out of the thin film during the deposition.

Specifically, following sputtering conditions are preferably exemplified to form an oxide semiconductor layers of the present invention.

The sputtering using a target as described above may preferably be carried out under the conditions that substrate temperature is set to a range of approximately from room temperature to 200° C. and additive amount of oxygen is appropriately controlled.

The additive amount of oxygen may appropriately be controlled according to the configuration of a sputtering system and the composition of the target so that the deposited oxide layer shows characteristics of a semiconductor. The additive amount of oxygen may preferably be controlled by the addition of oxygen so that the carrier concentration of a semiconductor becomes approximately from $10^{15}$ to $10^{16}$ cm$^{-3}$.

Furthermore, to form a film of such an oxide, the sputtering conditions may preferably be controlled in an appropriate manner, such as gas pressure, input power to be applied to a sputtering target, and T-S distance (the distance between the sputtering target and the substrate), to adjust the density of the oxide semiconductor layer. For example, when the gas pressure is lowered during film formation, sputtered atoms can be prevented from scattering one another, thereby making it possible to form a dense (high-density) film. Thus, the total gas pressure during film formation may preferably be in a range of approximately from 1 to 3 mTorr. Furthermore, the input power may preferably be as high as possible, and it is recommended to be set to about 200 W or higher.

The density of each of the oxide is influenced by the conditions of heat treatment after the film formation, and therefore, the conditions of heat treatment after the film formation may preferably be controlled in a proper manner. For example, the heat treatment after the film formation may be preferably conducted at roughly 250 to 400° C. for about 10 minutes to about 3 hours in an air atmosphere or a water-vapor atmosphere. Such heat treatment can also be controlled, for example, in the heat history during the fabrication process of TFTs. For example, the pre-annealing treatment (heat treatment carried out immediately after the patterning subsequent to the wet etching of the oxide semiconductor layer) increases the density of each of the oxide layers.

The present invention also encompasses a TFT comprising the oxide as a semiconductor layer (oxide semiconductor layer) for the TFT. The thin film transistor of the present invention is characterized in that the TFT comprises a laminate structure of the oxide semiconductor layers comprising the second oxide semiconductor layer and the first oxide semiconductor layer. Other than that, structural elements including a gate insulating film are not particularly limited. The TFT may comprise at least, for example, a gate electrode, a gate insulating film, the oxide semiconductor layers, a source electrode, a drain electrode (a source electrode and a drain electrode are occasionally referred collectively to a source-drain electrode in the present invention), and a passivation film in a BCE type; and an etch stopper layer in an ESL type; on a substrate. These structural elements are not particularly limited as long as they are those usually used in the field of TFT. The passivation film is formed on the source-drain electrode as illustrated in the figures. The purpose of forming the passivation film is to protect the gate insulating film, the oxide semiconductor layers, and the source-drain electrode.

Referring to FIG. 3, embodiments of a fabrication process of a BCE-type TFT without an etch stopper layer are described in the following. FIG. 3 and the following fabrication process demonstrate one example of preferred embodiments of the present invention, but it is not intended that the present invention be limited thereto. FIG. 3, for example, shows a TFT structure of a bottom gate type; however, TFTs are not limited thereto, and TFTs may be those of the top gate type, each having a gate insulating film and a gate electrode successively on above an oxide semiconductor layer.

As shown in FIG. 3, a gate electrode 2 and a gate insulating film 3 are formed on the substrate 1, and a second oxide semiconductor layer 4 is formed further thereon. On the second oxide semiconductor layer 4, a first oxide semiconductor layer 4A is formed. A source-drain electrode 5 is formed further thereon. A passivation film (insulating film) 6 is formed thereon, and a transparent conductive film (not shown in FIG. 3) is electrically connected to the drain electrode 5 through a contact hole 7.

The method of forming the gate electrode 2 and the gate insulating film 3 on the substrate 1 is not particularly limited, and any of the methods usually used can be employed. The kinds of the gate electrode 2 and the gate insulating film 3 are not particularly limited, and those which are widely used can be adopted. For example, metals having low electrical resistivity, such as Al and Cu, refractory metals having high heat resistance, such as Mo, Cr and Ti, and their alloys, can preferably be used for the gate electrode 2. Typical examples of the gate insulating film may include a silicon oxide layer ($SiO_2$), a silicon nitride layer (SiN), and a silicon oxynitride layer (SiON). In addition, oxides such as $Al_2O_3$ and $Y_2O_3$, and their laminates may also be used.

Then, the oxide semiconductor layers are formed in the order of the second oxide semiconductor layer 4 and the first oxide semiconductor layer 4A from the side of the substrate. The second oxide semiconductor layer 4 may preferably be formed by a DC sputtering method or an RF sputtering method using an IZTO sputtering target. The first oxide semiconductor layer 4A may be formed in a similar manner by a DC sputtering method or an RF sputtering method using an IGZTO sputtering target.

The second oxide semiconductor layer 4 and the first oxide semiconductor layer 4A are preferably formed successively in a vacuum atmosphere. If the chemical composition of the first oxide semiconductor is controlled so as to satisfy the range, then the sputtering rate as well as the wet etching property are improved.

The oxide semiconductor layer of the above-described structure is subjected to wet etching and then patterning. Just after the patterning, heat treatment (pre-annealing) may preferably be carried out for the purpose of improving the quality of the oxide semiconductor layer, resulting in an increase in the on-state current and field-effect mobility as the transistor characteristics and an improvement in the transistor performance. The pre-annealing conditions may be, for example, such that the temperature is from about 250° C. to about 400° C. and the time is from about 10 minutes to about 1 hour.

After the pre-annealing, a source-drain electrode may be formed. The kind of the source-drain electrode 5 is not particularly limited, and those which have widely been used can be employed. For example, similarly to the gate electrode, metals such as Mo, Al and Cu or their alloys may be used.

The source-drain electrode 5 may be formed by, for example, a deposition of the thin film by magnetron sputtering, followed by patterning by photolithography and wet etching.

Then, the passivation film 6 is formed on the oxide semiconductor layer 4A and source-drain electrode 5 by a CVD (Chemical Vapor Deposition) method. For the passivation film 6, $SiO_2$, SiN and SiON or the like can be used. The passivation film 6 may also be formed using a sputtering method. The surface of the semiconductor layer 4A may easily become conductive due to plasma-induced damage by CVD (presumably because oxygen defects formed on the surface of the first oxide semiconductor act as electron donors), and therefore, $N_2O$ plasma irradiation was carried out before the formation of the passivation film 6. The conditions described in the following literature may be employed as the $N_2O$ plasma irradiation conditions.

J. Park et al., Appl. Phys. Lett., 1993, 053505 (2008)

Then, according to a conventional method, a transparent conductive film is electrically connected to the drain electrode 5 through the contact hole 7. The kinds of the transparent conductive film and drain electrode are not particularly limited, and there can be used those which have usually been used. For the drain electrode, for example, materials exemplified for the source-drain electrode described above can be used.

Referring to FIG. 4, embodiments of a fabrication process of an ESL-type TFT having an etch stopper layer are described in the following. FIG. 4 and the following fabrication process demonstrate one example of preferred embodiments of the present invention, but it is not intended that the present invention be limited thereto. FIG. 4, for example, shows a TFT structure of a bottom gate type; however, TFTs are not limited thereto, and TFTs may be those of the top gate type, each having a gate insulating film and a gate electrode successively on an oxide semiconductor layer. In a TFT of top gate type, a first oxide semiconductor layer may be interposed between a second oxide semiconductor layer and an etch stopper layer.

As shown in FIG. 4, a gate electrode 2 and a gate insulating film 3 are formed on the substrate 1, and a second oxide semiconductor layer 4 is formed further thereon. On the second oxide semiconductor layer 4, a first oxide semiconductor layer 4A is formed. An etch stopper layer 8 and a source-drain electrode 5 are formed further thereon. A passivation film (insulating film) 6 is formed thereon, and a transparent conductive film (not shown in FIG. 4) is electrically connected to the drain electrode 5 through a contact hole 7.

A method of forming the gate electrode 2 and the gate insulating layer 3 on the substrate 1 is not particularly limited, and any of the methods usually used can be employed. The kinds of the gate electrode 2 and the gate insulating layer 3 are not particularly limited, and there can be used those which have widely been used. For example, metals of low electrical resistivity such as Al and Cu, and refractory metals of high heat resistance such as Mo, Cr, and Ti, and their alloys, can preferably be used for the gate electrode. Typical examples of the gate insulating film 3 may include a silicon nitride (SiN) film, a silicon oxide ($SiO_2$) film, and a silicon oxynitride (SiON) film. In addition, there can also be used oxides such as $Al_2O_3$ and $Y_2O_3$, and those which are formed by laminating them.

Then, the oxide semiconductor layers are formed in the order of the second oxide semiconductor layer 4 and the first oxide semiconductor layer 4A from the side of the substrate. The second oxide semiconductor layer 4 may preferably be formed by a DC sputtering method or an RF sputtering method using an IZTO sputtering target. The first oxide semiconductor layer 4A may be formed in a similar manner by a DC sputtering method or an RF sputtering method using an IGZTO sputtering target.

The second oxide semiconductor layer 4 and the first oxide semiconductor layer 4A are preferably formed successively in a vacuum atmosphere. If the chemical composition of the first oxide semiconductor is controlled so as to satisfy the range, then the sputtering rate as well as the wet etching property are improved.

The oxide semiconductor layer of the above-described structure is subjected to wet etching and then patterning. Just after the patterning, heat treatment (pre-annealing) may preferably be carried out for the purpose of improving the quality of the oxide semiconductor layer, resulting in an increase in the on-state current and field-effect mobility as the transistor characteristics and an improvement in the transistor performance. The pre-annealing conditions may be, for example, such that the temperature is from about 250° C. to about 400° C. and the time is from about 10 minutes to about 1 hour.

After the pre-annealing, an etch stopper layer 8 is formed. An insulating film such as $SiO_2$ is usually used for the etch stopper layer 8. If a source-drain electrode 5 is formed without forming the etch stopper layer 8, there may be an increasing risk of damaging the oxide semiconductor layer during an etching process of the source-drain electrode 5, which deteriorates the TFT characteristics. The kind of the etch stopper layer 8 is not particularly limited, and there can be used those which have widely been used. As for a passivation film $SiO_2$, for example, may be used for the etch stopper layer.

The kind of the source-drain electrode 5 is not particularly limited, and there can be used those which have widely been used. For example, similarly to the gate electrode, metals such as Mo, Al and Cu or their alloys may be used. A sputtering method is widely used for the formation of the electrode.

The source-drain electrode 5 may be formed by depositing a metal thin film by, for example, magnetron sputtering, followed by patterning by photolithography and wet etching.

Then, the passivation film 6 is formed on the oxide semiconductor layer 4A and the source-drain electrode 5 by a CVD (Chemical Vapor Deposition) method. For the passivation film 6 to be formed by the CVD method, there can be used, for example, $SiO_2$, SiN and SiON. The passivation film 6 may also be formed using a sputtering method.

Then, according to a conventional method, the transparent conductive film is electrically connected to the drain electrode 5 through the contact hole 7. The kinds of the transparent conductive film and drain electrode are not particularly limited, and there can be used those which have usually been used. For the drain electrode, there can be used, for example, materials exemplified for the source-drain electrode described above.

EXAMPLES

The present invention is described hereinafter more specifically by way of Examples, but the present invention is not limited to the following Examples. The present invention can be put into practice after appropriate modifications or variations within a range meeting the gist described above and below, all of which are included in the technical scope of the present invention.

Example 1

BCE Type (Evaluation of Stress Resistance)

TFTs comprising an oxide semiconductor layer were fabricated as shown in FIGS. 1 and 3 to evaluate the stress resistance.

First, a Mo thin film of 100 nm in thickness as a gate electrode 2 and $SiO_2$ (200 nm) as a gate insulating film 3 were successively deposited on a glass substrate 1 ("EAGLE XG" available from Corning Inc, having a diameter of 100 mm and a thickness of 0.7 mm). The gate electrode 2 was deposited using a pure Mo sputtering target by a DC sputtering method under the conditions: deposition temperature, room temperature; sputtering power, 300 W; carrier gas, Ar; gas pressure, 2 mTorr; Ar gas flow rate, 20 sccm. Further, the gate insulating film 3 was formed by a plasma CVD method under the conditions: carrier gas, a mixed gas of $SiH_4$ and $N_2O$; plasma power, 100 W; gas pressure, 133 Pa; and deposition temperature, 320° C.

Then, oxide semiconductor layers having various compositions and structures as described in Table 1 were deposited by a sputtering method under the conditions described below using sputtering targets having chemical compositions corresponding to the compositions of the oxide semiconductor layers.

Specifically, Sample No. 1 in Table 1 was a conventional example having a structure as shown in FIG. 1. An amorphous oxide semiconductor IZTO single layer (In:Zn:Sn=20:56.7:23.3 in atomic % ratio) was deposited as the oxide semiconductor layer 4 on a gate insulating film 3. The first oxide semiconductor layer 4A was not deposited in No. 1

Sample No. 2 was an example having a structure shown in FIG. 3. After depositing second oxide semiconductor layer 4 of IZTO having the same atomic % ratio as sample No. 1 on a gate insulating film 3, a first oxide semiconductor layer 4A (In:Ga:Zn:Sn=21.1:16.7:53.3:8.9 in atomic % ratio) was deposited.

The second oxide semiconductor layer 4 and the first oxide semiconductor layer 4A, constituting the oxide semiconductor layers, were successively formed without opening the chamber to the air.

Contents of the respective metal elements in the oxide semiconductor layers thus obtained were analyzed by XPS (X-ray Photoelectron Spectroscopy). The contents of the metal elements and the compositional ratio in the first and second oxide semiconductor layers were the same as those of respective oxide sputtering targets used for the deposition.

The second oxide semiconductor layer 4 and the first oxide semiconductor layer 4A were formed by a sputtering method. The apparatus used in the sputtering was "CS-200" available from ULVAC, Inc., and the sputtering conditions were as follows:

Substrate temperature: room temperature
Gas pressure: 1 mTorr
Oxygen partial pressure: $O_2/(Ar+O_2)=4\%$
Film formation power: 2.55 $W/cm^2$ After the oxide semiconductor layers were deposited as described above, patterning was carried out by photolithography and wet etching. "ITO-07N" available from Kanto Chemical Co., Inc. was used as a wet etchant. It was confirmed that each of the oxide semiconductor layer in the TFT device was properly etched without a significant level difference due to difference in etching rates between the first and the second oxide semiconductors.

After patterning of each oxide semiconductor layer, pre-annealing treatment was carried out to improve the film quality. The pre-annealing was carried out at 350° C. under air atmosphere for 1 hour.

Then, a source-drain electrode 5 was deposited by a lift-off method using pure Mo. More specifically, after patterning was carried out using a photoresist, a Mo thin film having a thickness of 100 nm was deposited by a DC sputtering method. The deposition condition of the Mo thin film for a source-drain electrode was the same as that used in the case of the gate electrode described above. The Mo thin film was subsequently patterned by photolithography and wet etching. An etching solution "AC 101" available from Nagase Chemtex Co. was used as the wet etchant. Specifically, a solution of AC 101 and diluted water mixed with a ratio of 1 to 0.75 was used as an etchant for the wet etching conducted at room temperature. For the purpose of making sure to prevent shunting the source-drain electrode, each of the films was over-etched by 20% with respect to the thickness. An unnecessary photoresist was then removed with an ultrasonic washing apparatus in acetone, to obtain each of the TFT having a channel length of 10 μm and a channel width of 25 μm.

After the source-drain electrode 5 was formed as described above, a passivation film 6 to protect an oxide semiconductor layer was formed thereon. A layered film (having the total thickness of 350 nm) consisting of $SiO_2$ (having a thickness of 100 nm) and SiN (having a thickness of 150 nm) was used as the passivation film 6. The formation of the $SiO_2$ and SiN films described above was carried out by a plasma CVD method using "PD-220NL" available from SAMCO Inc. In this Example, after plasma treatment was carried out by $N_2O$ gas, the $SiO_2$ film and the SiN film were successively formed. A mixed gas of $N_2O$ and $SiH_4$ was used for the formation of the $SiO_2$ film, and a mixed gas of $SiH_4$, $N_2$ and $NH_3$ was used for the formation of the SiN film. In both cases, the film formation power was set to 100 W and the film formation temperature was set to 150° C.

Then, a contact hole 7 to be used for probing to evaluate transistor characteristics was formed in the passivation film 6 by photolithography and dry etching.

For each of the TFTs thus obtained, stress resistance was evaluated after light irradiation while applying negative bias as shown below.

In the present Example, stress application tests were carried out by light irradiation while applying negative bias to the gate electrode. The stress application conditions were as described below. As the wavelength of light, about 400 nm was selected, which is near the band gaps of oxide semiconductors and at which transistor characteristics may easily vary.

Gate voltage: −20 V
Substrate temperature: 60° C.
Light stress
Wavelength: 400 nm
Illuminance (intensity of light irradiated onto TFTs): 0.1 $\mu W/cm^2$
Light source: LED available from OPTOSUPPLY Ltd. (light intensity was adjusted with an ND filter)
Stress application time: 2 hours In the present example, variation of threshold voltage during the stress biasing test was defined as the threshold voltage shift $\Delta V_{th}$, and employed as an index of stress resistance in the TFT characteristics. In the present example, TFTs having a $\Delta V_{th}$ (absolute value) of 12.25 V or lower, which was lower than $\Delta V_{th}$ of the conventional example No. 1, were evaluated as "good" in terms of stress resistance.

TABLE 1

| Sample No. | Structure of oxide semiconductor layers (First oxide semiconductor layer/Second oxide semiconductor layer) | Configuration | $\Delta V_{th}$ (V) | Evaluation |
|---|---|---|---|---|
| 1 | IZTO (40 nm) | FIG. 1 | 12.25 | — |
| 2 | IGZTO (20 nm)/IZTO (20 nm) | FIG. 3 | 9.50 | Good |

Upon biasing the stress, the threshold voltage of the conventional example No. 1 shown in FIG. 1 largely shifted toward negative side, and threshold voltage shift ($\Delta V_{th}$) reached 12.25 V after 2 hours. No. 2 shown in FIG. 3, on the other hand, showed smaller threshold voltage shift after 2 hours as compared to the conventional example No. 1, demonstrating better stress resistance.

Example 2

BCE Type (Evaluation of Wet Etching Property)

For the purpose of evaluation of the wet etching property, samples were prepared without making the oxide semiconductor layers into a laminate structure. Respective etching rate of a first oxide semiconductor layer, a second oxide semiconductor layer, and a pure Mo film was measured in wet etching solutions for the oxide semiconductor layers or the source-drain electrode. The adaptability to wet etching process in the wet etchant solution for the oxide semiconductor (difference in etching rates between the first and second oxide semiconductor layers) and durability in the wet etchant solution for the source-drain electrode (difference in etching rates between the first oxide semiconductor layer and the pure Mo film) were evaluated.

Wet etching property of the first oxide semiconductor layer used for the laminate structure of the present invention was evaluated by preparing a sample as follows.

A Mo thin film as a gate electrode and $SiO_2$ as a gate insulating film were successively deposited on a glass substrate in a similar manner as Example 1. Subsequently, a first oxide semiconductor layer of 40 nm in thickness was deposited on a static substrate using four sputtering targets of $In_2O_3$, $Ga_2O_3$, ZnO, and $SnO_2$ disposed around the substrate by using a sputtering method under the same conditions as for the first oxide semiconductor layers prepared in Example 1.

In the configuration of the film formation, it is possible to make a variation in compositional ratios of IGZTO depending on position in a substrate. The ratio of elements constituting a target decreases in a deposited film with distance from the target. For example, the compositional ratio was In:Ga:Zn:Sn=13.9:9.6:55.8:20.7 (No. 9 in Table 2) at a position in the vicinity of the $SnO_2$ target, while the ratio was In:Ga:Zn:Sn=5.6:39.8:38.9:15.7 (No. 6) at a position around the center of the substrate. The ratio was In:Ga:Zn:Sn=6.0:15.0:73.0:6.0 (No. 5) at a position in the vicinity of the ZnO target.

It is noted here that a method like this has been conventionally established as a measure to investigate an optimum contents ratio in a deposited film.

Further, an IZTO film (In:Zn:Sn=20:56.7:23.3 in atomic % ratio) corresponding to the second oxide semiconductor layer and a pure Mo film corresponding to the source-drain electrode were prepared in the same conditions as for Example 1. And their wet etching properties were investigated in respective wet etchant solution in the same manner.

Wet etching property (A) of each of the samples was evaluated by immersing them in the wet etchant for oxide semiconductor "ITO-07N" available from Kanto Chemical Co., Inc., at room temperature. Etching rate was determined by measuring change in thickness (amount of etching) of respective oxide semiconductor film before and after the wet etching for a predetermined period of time.

(B) Each of the samples was also immersed in a mixed-etchant solution of AC 101 and diluted water mixed with a ratio of 1 to 0.75, which was a wet etching solution for a source-drain electrode, at room temperature to conduct wet etching. Etching rate was calculated in a similar manner as described above.

Further, etching rate to the wet etchant for oxide semiconductor, measured for the IZTO film equivalent to the second oxide semiconductor layer, was 49 nm/min. Etching rate of pure Mo film to the wet etchant for source-drain electrode was 300 nm/min.

In the present invention, samples having a ratio of etching rate of IGZTO film corresponding to the first oxide semiconductor layer to that of an IZTO film corresponding to the second oxide semiconductor layer in a range from 0.1 to 4 were evaluated as "good" in terms of (A) adaptability to wet etching process in the wet etchant solution for the oxide semiconductor. Those having an etching rate ratio out of the range were evaluated as "bad".

Further, samples having a ratio of etching rate of the first oxide semiconductor layer to that of the Mo film smaller than or equal to one half were evaluated as "good" in terms of (B) the durability in the wet etchant solution for the source-drain electrode. Those having an etching rate ratio more than one half were evaluated as "bad".

(Evaluation of Stress Resistance)

Further, BCE-type TFTs shown in FIG. 3 were fabricated in the same method as described in Example 1 except for forming the first oxide semiconductor layer using targets having respective chemical composition ratio shown in Table 2. The stress resistance of respective TFT was evaluated in the same manner as in Example 1. In the present Example 2, TFTs having a value of threshold voltage shift of 8.0 V or lower were evaluated as "good" in terms of stress resistance.

(Total Evaluation)

Each of the samples was evaluated on the basis of criteria shown below based on the results of the evaluations of stress resistance and wet etching property.

"Good": stress resistance $\Delta V_{th} \leq 8.0$ V, and
the wet etching property was evaluated as "good" to both of the etchants for the oxide semiconductor layer and the source-drain electrode.

"Bad": Other than those evaluated as "good".

It is noted here that the stress resistance may be considered superior to that of the second oxide semiconductor single layer if $\Delta V_{th}$ is smaller than or equal to 8.0 V.

No. 4 was an example having small amount of Sn. Due to the insufficient Sn content similar to No. 1, the first oxide semiconductor layer was eluted by a wet etchant for the source-drain electrode.

No. 5 was an example having large amount of Zn and small amount of Sn. Due to the large content of Zn, it had a small etching rate as compared to IZTO. Further, because of the insufficient amount of Sn, the first oxide semiconductor layer was eluted by a wet etchant for the source-drain electrode.

Example 3

ESL Type

TFTs comprising an oxide semiconductor layer were fabricated as shown in FIGS. 2, 4 and 5 to evaluate the stress resistance.

First, a Mo thin film of 100 nm in thickness as a gate electrode 2 and SiO$_2$ (200 nm) as a gate insulating film 3 were successively deposited on a glass substrate 1 ("EAGLE XG" available from Corning Inc, having a diameter of 100 mm and a thickness of 0.7 mm). The gate electrode 2 was deposited using a pure Mo sputtering target by a DC sputtering method under the conditions: deposition temperature, room temperature; sputtering power, 300 W; carrier gas, Ar; gas pressure, 2 mTorr; Ar gas flow rate, 20 sccm. Further, the gate insulating film 3 was formed by a plasma CVD method under the conditions: carrier gas, a mixed gas of SiH$_4$ and N$_2$O; plasma power, 100 W; gas pressure, 133 Pa; and deposition temperature, 320° C.

Next, oxide semiconductor layers having various compositions and structures as described in Table 3 were deposited by a sputtering method under the conditions described below using sputtering targets having compositions corresponding to those of the respective oxide semiconductor layer to a specified film thickness.

Specifically, No. 1 in Table 3 was a conventional example having a structure as shown in FIG. 2. An amorphous oxide semiconductor IZTO single layer (In:Zn:Sn=20:56.7:23.3 in atomic % ratio) was deposited as the oxide semiconductor

TABLE 2

| Sample No. | In (at %) | Ga (at %) | Zn (at %) | Sn (at %) | $\Delta V_{th}$ (V) | Etchant for oxide semiconductor Ratio to IZTO | Etchant for source-drain electrode Ratio to Mo | Evaluation |
|---|---|---|---|---|---|---|---|---|
| 1 | 1.9 | 57.9 | 34.1 | 6.2 | 8.25 | bad | bad | bad |
| 2 | 3.4 | 49.5 | 36.8 | 10.2 | 4.25 | good | good | good |
| 3 | 3.2 | 46.4 | 42.1 | 8.3 | 3.75 | good | good | good |
| 4 | 2.9 | 42.7 | 47.7 | 6.7 | 11.00 | good | bad | bad |
| 5 | 6.0 | 15.0 | 73.0 | 6.0 | 6.00 | bad | bad | bad |
| 6 | 5.6 | 39.8 | 38.9 | 15.7 | 6.50 | good | good | good |
| 7 | 16.6 | 16.8 | 47.2 | 19.4 | 6.50 | good | good | good |
| 8 | 3.0 | 49.5 | 38.3 | 9.3 | 3.75 | good | good | good |
| 9 | 13.9 | 9.6 | 55.8 | 20.7 | 7.70 | good | good | good |
| 10 | 24.0 | 8.0 | 55.0 | 12.0 | 4.50 | good | good | good |

Nos. 2, 3, and 6 to 10 were examples having excellent stress resistance and etching property as the chemical composition of each of the first oxide semiconductor was controlled to the specified range of the present invention.

No. 1 was an example having small amounts of Zn and Sn. Because of the small amount of Zn, No. 1 had a small etching rate as compared to IZTO, showing bad adaptability to wet etching process in the wet etchant for the oxide semiconductor. Due to the insufficient Sn content, the stress resistance was also poor, and the first oxide semiconductor layer was eluted by a wet etchant for the source-drain electrode.

layer 4 on a gate insulating film 3. The first oxide semiconductor layer 4A was not deposited in No. 1.

Samples No. 2 to 5 were examples having a structure shown in FIG. 4. After depositing the second oxide semiconductor layer 4 of IZTO having the same atomic % ratio as sample No. 1 on a gate insulating film 3, a first oxide semiconductor layer 4A (In:Ga:Zn:Sn=21.1:16.7:53.3:8.9 in atomic % ratio) was deposited.

Sample No. 6 was an example having a structure shown in FIG. 5. After depositing the first oxide semiconductor layer 4A of IGZTO having the same atomic % ratio as samples No.

2 to 5 on a gate insulating film 3, a second oxide semiconductor layer 4 having the same atomic % ratio as sample No. 1 was deposited.

No. 7 was a conventional example having a structure as shown in FIG. 2. An amorphous oxide semiconductor IZTO single layer having a different chemical composition from No. 1 (In:Zn:Sn=30:49.6:20.4 in atomic % ratio) was deposited as the oxide semiconductor layer 4 on a gate insulating film 3. The first oxide semiconductor layer 4A was not deposited.

Nos. 8 to 19 were examples having a structure shown in FIG. 4. After depositing the second oxide semiconductor layer 4 of IZTO having the same atomic % ratio as sample No. 7 on a gate insulating film 3, a first oxide semiconductor layer 4A of respective chemical composition shown in Table 3 was deposited.

The second oxide semiconductor layer 4 and the first oxide semiconductor layer 4A both constituting respective oxide semiconductor layer in Nos. 2 to 6 and 8 to 19 were successively formed without opening the chamber to the air. The contents of the respective metal elements in the oxide semiconductor layers thus obtained were analyzed by XPS (X-ray Photoelectron Spectroscopy). The contents of the metal elements and the compositional ratio in the first and second oxide semiconductor layers were the same as those of respective oxide sputtering targets used for the deposition.

The second oxide semiconductor layer 4 and the first oxide semiconductor layer 4A were formed by DC sputtering method. The apparatus used in the sputtering was "CS-200" available from ULVAC, Inc., and the sputtering conditions were as follows:

Substrate temperature: room temperature
Gas pressure: 1 mTorr
Oxygen partial pressure: $O_2/(Ar+O_2)$=4%
Film formation power: 2.55 W/cm$^2$ After each oxide semiconductor layer was deposited in the manner described above, patterning was carried out by photolithography and wet etching. "ITO-07N," available from Kanto Chemical Co., Inc., was used as a wet etchant. It was confirmed that each of the oxide semiconductor layer in the TFT device was properly etched without a significant level difference due to difference in etching rates between the first and the second oxide semiconductors.

In succession to the patterning of each oxide semiconductor layer, pre-annealing treatment was carried out to improve the film quality. The pre-annealing was carried out at 350° C. under air atmosphere for 1 hour.

Subsequently, by using a plasma CVD method, a silicon oxide ($SiO_2$) film of 100 nm in thickness was deposited as the etch stopper layer 8 on the oxide semiconductor channel layer. Specifically, the film was deposited by using a mixed gas of $SiH_4$ and $N_2O$ at a substrate temperature of 200° C. with an input power of 100 W. The etch stopper layer 8 was deposited by using the same apparatus as for the formation of the gate insulating film.

Then, a source-drain electrode 5 was fabricated by a lift-off method using pure Mo. More specifically, after patterning was carried out using a photoresist, a Mo thin film (having a thickness of 100 nm) was deposited by a DC sputtering method. The deposition condition of the Mo thin film for a source-drain electrode was the same as that used in the case of the gate electrode described above. Then, an unnecessary photoresist was removed with an ultrasonic washing apparatus in acetone, resulting in a TFT having a channel length of 10 μm and a channel width of 25 μm.

After the source-drain electrode 5 was formed as described above, a passivation film 6 was formed thereon. A layered film (having the total thickness of 350 nm) consisting of $SiO_2$ (having a thickness of 100 nm) and SiN (having a thickness of 150 nm) was used as the passivation film 6. The formation of $SiO_2$ and SiN described above was carried out by a plasma CVD method using "PD-220NL" available from SAMCO Inc. In this Example, after plasma treatment was carried out by $N_2O$ gas, the $SiO_2$ film and the SiN film were successively formed. A mixed gas of $N_2O$ and $SiH_4$ was used for the formation of the $SiO_2$ film, and a mixed gas of $SiH_4$, $N_2$ and $NH_3$ was used for the formation of the SiN film. In both cases, the film formation power was set to 100 W and the film formation temperature was set to 150° C.

Then, a contact hole 7 to be used for probing to evaluate transistor characteristics was formed in the passivation film 6 by photolithography and dry etching.

For each of the TFTs thus obtained, stress resistance was evaluated after light irradiation while applying negative bias as shown below.

In the present Example, stress application tests were carried out by white light irradiation while applying negative bias to the gate electrode. The stress application conditions were as described below. As the wavelength of light, about 400 nm was selected, which is near the band gaps of oxide semiconductors and at which transistor characteristics may easily vary.

Gate voltage: −20 V
Substrate temperature: 60° C.
Optical stress:
Wavelength: 400 nm
Illuminance (intensity of light irradiated onto TFTs): 0.1 μW/cm$^2$
Light source: LED available from OPTOSUPPLY Ltd. (light intensity was adjusted with an ND filter)
Stress application time: 2 hours In the present example, variation of threshold voltage during the stress biasing test for 2 hours was defined as the threshold voltage shift $\Delta V_{th}$, and employed as an index of stress resistance in the TFT characteristics. For Nos. 2 to 6, TFTs having a $\Delta V_{th}$ (absolute value) of 4.00 V ($\Delta V_{th}$ of No. 1) or lower were evaluated as "good". Those having a $\Delta V_{th}$ greater than 4.00 V were evaluated as "bad". For Nos. 8 to 19, TFTs having a $\Delta V_{th}$ (absolute value) of 5.50 V ($\Delta V_{th}$ of No. 7) or lower were evaluated as "good". Those having a $\Delta V_{th}$ greater than 5.50 V were evaluated as "bad".

TABLE 3

| Sample No. | First oxide semiconductor layer | | | | | Second oxide semiconductor layer | | | | Configuration | $\Delta V_{th}$ (V) | Evaluation |
|---|---|---|---|---|---|---|---|---|---|---|---|---|
| | In (at %) | Ga (at %) | Zn (at %) | Sn (at %) | Thickness (nm) | In (at %) | Zn (at %) | Sn (at %) | Thickness (nm) | | | |
| 1 | — | — | — | — | 0 | 20 | 56.7 | 23.3 | 40 | FIG. 2 | 4.00 | — |
| 2 | 21.1 | 16.7 | 53.3 | 8.9 | 35 | | | | 5 | FIG. 4 | 0.75 | Good |
| 3 | | | | | 30 | | | | 10 | FIG. 4 | 0.75 | Good |

TABLE 3-continued

| Sample No. | First oxide semiconductor layer | | | | | Second oxide semiconductor layer | | | | | | |
|---|---|---|---|---|---|---|---|---|---|---|---|---|
| | In (at %) | Ga (at %) | Zn (at %) | Sn (at %) | Thickness (nm) | In (at %) | Zn (at %) | Sn (at %) | Thickness (nm) | Configuration | $\Delta V_{th}$ (V) | Evaluation |
| 4 | | | | | 20 | | | | 20 | FIG. 4 | 0.50 | Good |
| 5 | | | | | 10 | | | | 30 | FIG. 4 | 2.25 | Good |
| 6 | | | | | 10 | | | | 30 | FIG. 5 | 0.75 | Good |
| 7 | — | — | — | — | 0 | 30 | 49.6 | 20.4 | 40 | FIG. 2 | 5.50 | — |
| 8 | 19.5 | 44.6 | 24.2 | 11.8 | 10 | | | | 30 | FIG. 4 | 5.00 | Good |
| 9 | | | | | 20 | | | | 20 | FIG. 4 | 3.75 | Good |
| 10 | | | | | 30 | | | | 10 | FIG. 4 | 2.25 | Good |
| 11 | 14 | 33 | 38 | 15 | 10 | | | | 30 | FIG. 4 | 6.75 | Bad |
| 12 | | | | | 20 | | | | 20 | FIG. 4 | 5.25 | Good |
| 13 | | | | | 30 | | | | 10 | FIG. 4 | 4.75 | Good |
| 14 | 15 | 23 | 44 | 18 | 10 | | | | 30 | FIG. 4 | 7.25 | Bad |
| 15 | | | | | 20 | | | | 20 | FIG. 4 | 6.25 | Bad |
| 16 | | | | | 30 | | | | 10 | FIG. 4 | 5.25 | Good |
| 17 | 17 | 17 | 47 | 19 | 10 | | | | 30 | FIG. 4 | 8.50 | Bad |
| 18 | | | | | 20 | | | | 20 | FIG. 4 | 6.75 | Bad |
| 19 | | | | | 30 | | | | 10 | FIG. 4 | 5.50 | Good |

Upon biasing the stress, the threshold voltage of the conventional example No. 1 shown in FIG. 2 largely shifted toward negative side, and threshold voltage shift ($\Delta V_{th}$) was 4.00 V after 2 hours. On the other hand, Nos. 2 to 5 and No. 6 shown in FIG. 3 and FIG. 5, respectively, showed smaller threshold voltage shift after 2 hours as compared to the conventional example No. 1, demonstrating better stress resistance.

Nos. 7 to 19 were examples in which IZTO containing 30% In were used for the second oxide semiconductor layer, which was higher than the 20% In in the second oxide semiconductor layers for Nos. 1 to 6. Upon biasing the stress, the threshold voltage of the conventional example No. 7 shown in FIG. 2 largely shifted toward negative side, and threshold voltage shift ($\Delta V_{th}$) was 5.50 V after 2 hours. When the first and second oxide semiconductor layers were laminated, on the other hand, $\Delta V_{th}$ were decreased as compared to No. 7, demonstrating a trend toward improvement in the stress resistance.

The stress resistance ($\Delta V_{th}$) was improved by adding Ga 15% or more in the thin film transistors fabricated only with the chemical composition of the first oxide semiconductor. However, if a second oxide semiconductor layer was laminated on the first oxide semiconductor layer, the stress resistance showed changes influenced by the second oxide semiconductor.

It was elucidated from the results of Nos. 8 to 19 that $\Delta V_{th}$ was likely to be decreased, in other words, the stress resistance was likely to be improved by increasing the amount of Ga to 33% or higher in the first oxide semiconductor layer onto which IZTO containing In of 30% or more, higher than those in the second oxide semiconductor layers in Nos. 1 to 6, was laminated as the second oxide semiconductor layer.

It was also found by comparing No. 1 and No. 7, both of which were fabricated with single layer second oxide semiconductor, and by comparing Nos. 3 to 5 (having IZTO containing 20% In as the second oxide semiconductor layer) and Nos. 17 to 19 (having IZTO containing 30% In as the second oxide semiconductor layer), in which the chemical composition and the thickness of the first oxide semiconductor layer were similar with one another, that $\Delta V_{th}$ was likely to be increased in those containing higher amount of In of 30% in the second oxide semiconductor layers as in Nos. 7, 17, 18, and 19.

Furthermore, it was found from the results of Nos. 8 to 19 that $\Delta V_{th}$ was likely to be decreased in TFTs if the thickness of the first oxide semiconductor layer was the similar to or more than that of the second oxide semiconductor layer in which higher amount of In was contained.

From these results, it was concluded preferable that the amount of Ga is more than or equal to 33% in the first oxide semiconductor layer and that the thickness of the first oxide semiconductor layer is similar to or more that of the second oxide semiconductor layer, in case IZTO containing higher amount of In is to be used as the second oxide semiconductor. The upper limit of Ga in the first oxide semiconductor layer is preferably less than 50 atomic % considering to secure proper film formation as described above.

Example 4

ESL Type (Evaluation of Wet Etching Property)

For the purpose of evaluation of the wet etching property, samples were prepared without making the oxide semiconductor layers into a laminate structure. Etching rates of a first oxide semiconductor layer and a second oxide semiconductor layer were measured. The adaptability to wet etching process in the wet etchant solution for the oxide semiconductor (difference in etching rates between the first and second oxide semiconductor layers) were evaluated.

Wet etching property of the first oxide semiconductor layer used for the laminate structure of the present invention was evaluated by preparing a sample as follows.

A Mo thin film as a gate electrode and $SiO_2$ as a gate insulating film were successively deposited on a glass substrate in a similar manner as Example 3. Subsequently, a first oxide semiconductor layer of 40 nm in thickness was deposited on a static substrate using four sputtering targets of $In_2O_3$, $Ga_2O_3$, ZnO, and $SnO_2$ disposed around the substrate by using a DC sputtering method under the same conditions as for the first oxide semiconductor layers prepared for the evaluation of the stress resistance of the Example 3.

In the configuration of the film formation, it is possible to make a variation in compositional ratios of IGZTO depending on position in a substrate. The ratio of elements constituting a target decreases in a deposited film with distance from the target. For example, the compositional ratio was In:Ga:Zn:Sn=3.6:52.7:29.7:14.0 (No. 1 in Table 4) at a position in the vicinity of the $SnO_2$ target, while the ratio was In:Ga:Zn:Sn=5.0:35.3:49.1:10.6 (No. 10) at a position around the center of the substrate. The ratio was In:Ga:Zn:Sn=10.6:13.0:60.8:15.5 (No. 15) at a position in the vicinity of the ZnO target.

It is noted again that a method like this has been conventionally established as a measure to investigate an optimum contents ratio in a deposited film.

An IZTO with In:Zn:Sn=20:56.7:23.3 in atomic % ratio, which was equivalent to the second oxide semiconductor layer was deposited in the same condition as for the second oxide semiconductor layers of Example 3, and the wet etching property was evaluated in a similar manner to Nos. 1 to 16.

Wet etching property of each of the samples was evaluated by immersing each of the samples in (A) the wet etchant for oxide semiconductor "ITO-07N" available from Kanto Chemical Co., Inc., at room temperature. Etching rate was determined by measuring change in thickness (amount of etching) of respective oxide semiconductor film before and after the wet etching for a predetermined period of time.

Further, etching rate measured for the IZTO film equivalent to the second oxide semiconductor layer was 49 nm/min.

In the present invention, samples having a ratio of etching rate of respective IGZTO film (Nos. 1 to 16) to that of an IZTO film corresponding to the second oxide semiconductor in a range from 0.1 to 4 were evaluated as "good" in terms of (A) the adaptability to wet etching process in the wet etchant solution for the oxide semiconductor. Those having an etching rate ratio out of the range were evaluated as "bad".

(Evaluation of Stress Resistance)

Further, ESL-type TFTs shown in FIG. 4 were fabricated in the same method as described in Example 3 except for forming the first oxide semiconductor layer using targets having respective chemical composition ratio shown in Table 4. The stress resistance of respective TFT was evaluated in the same criteria as in Example 3. In the present Example, TFTs having a value of threshold voltage shift of 4.0 V or lower were evaluated as "good" in terms of stress resistance.

(Total Evaluation)

Each of the samples was evaluated on the basis of criteria shown below based on the results of the evaluations of stress resistance and wet etching property.

"Good": stress resistance $\Delta V_{th} \leq 4.0$ V, and the wet etching property was evaluated as "good".

"Bad": Other than those evaluated as "Good".

It is noted here that the stress resistance of the first oxide semiconductor may be considered superior to that of the second oxide semiconductor layer if $\Delta V_{th}$ is smaller than or equal to 4.0 V.

TABLE 4

| Sample No. | In (at %) | Ga (at %) | Zn (at %) | Sn (at %) | $\Delta V_{th}$ (V) | Etchant for oxide semiconductor Ratio to IZTO | Evaluation |
|---|---|---|---|---|---|---|---|
| 1 | 3.6 | 52.7 | 29.7 | 14.0 | 2.50 | bad | bad |
| 2 | 3.4 | 49.5 | 36.8 | 10.2 | 2.50 | good | good |
| 3 | 3.2 | 46.4 | 42.1 | 8.3 | 1.00 | good | good |
| 4 | 5.8 | 41.4 | 31.8 | 21.0 | 2.75 | bad | bad |
| 5 | 5.7 | 40.5 | 36.5 | 17.3 | 2.50 | good | good |
| 6 | 5.3 | 37.9 | 43.9 | 13.0 | 1.25 | good | good |
| 7 | 16.6 | 16.8 | 47.2 | 19.4 | 0.50 | good | good |
| 8 | 13.9 | 9.6 | 55.8 | 20.7 | 1.75 | good | good |
| 9 | 21.1 | 16.7 | 53.3 | 8.9 | 2.75 | good | good |
| 10 | 5.0 | 35.3 | 49.1 | 10.6 | 0.75 | good | good |
| 11 | 4.3 | 30.5 | 57.4 | 7.8 | 2.75 | good | good |
| 12 | 7.8 | 26.8 | 49.6 | 15.7 | 0.50 | good | good |
| 13 | 7.7 | 12.4 | 69.4 | 7.7 | 4.50 | bad | bad |
| 14 | 12.5 | 15.3 | 48.6 | 23.5 | 2.00 | good | good |
| 15 | 10.6 | 13.0 | 60.8 | 15.5 | 3.75 | good | good |
| 16 | 24.0 | 7.9 | 55.0 | 12.0 | 4.50 | good | bad |

Nos. 2, 3, 5 to 12, 14, and 15 were examples having excellent stress resistance and etching property as the chemical composition of each of the first oxide semiconductor were controlled to the specified range of the present invention.

No. 1 was an example having a small amount of Zn. It had a small etching rate and poor etching property due to insufficient Zn content.

No. 13 was an example having excessive amount of Zn, which causes higher etching rates of the first oxide semiconductor layer than that of IZTO constituting the second oxide semiconductor layer, and excessive side wall etching. As a result, thin film transistors of desired pattern and profile were not obtained.

No. 16 was an example having an amount of Ga in the first oxide semiconductor layer lower than that specified in the present invention. While having a good etching rate ratio to the second oxide semiconductor layer constituted by IZTO, No. 16 was insufficient in terms of the stress resistance.

The present application claims the benefit of priority based on Japanese Patent Application No. 2012-129399 filed on Jun. 6, 2012. The entire contents of the specification of Japanese Patent Application No. 2012-129399 filed on Jun. 6, 2012 are incorporated herein by reference.

EXPLANATION OF REFERENCE NUMERALS

1 Substrat
2 Gate electrode
3 Gate insulating film
4 Second oxide semiconductor layer
4A First oxide semiconductor layer
5 Source-drain electrode
6 Passivation film (insulating film)
7 Contact hole
8 Etch stopper layer

The invention claimed is:

1. A thin film transistor, comprising;
a gate electrode, a gate insulating film, an oxide semiconductor layer, an etch stopper layer, a source-drain electrode, and a passivation film configured to protect the source-drain electrode, on a substrate in this order,
wherein the oxide semiconductor layer is a laminate comprising:
a first oxide semiconductor layer consisting of In, Ga, Zn, Sn, and O; and
a second oxide semiconductor layer consisting of In, Zn, Sn, and O,
wherein
the contents of respective metal elements relative to the total amount of all the metal elements other than oxygen in the first oxide semiconductor layer are:
In: smaller than or equal to 25 atomic %, excluding 0 atomic %;
Ga: larger than or equal to 8.0 atomic % and smaller than or equal to 30 atomic %;
Zn: larger than or equal ton 30.0 atomic % and smaller than or equal to 65 atomic %; and
Sn: larger than or equal to 5 atomic % and smaller than or equal to 30 atomic %.

2. The thin film transistor according to claim 1, wherein the contents of respective metal elements relative to the total amount of all the metal elements other than oxygen in the first oxide semiconductor layer are:
In: smaller than or equal to 20 atomic %, excluding 0 atomic %;
Ga: larger than or equal to 15 atomic % and smaller than or equal to 30 atomic %;

Zn: larger than or equal to 35 atomic % and smaller than or equal to 65 atomic %; and Sn: larger than or equal to 8 atomic % and smaller than or equal to 30 atomic %.

3. The thin film transistor according to claim 1, wherein a thickness of the second oxide semiconductor layer is larger than or equal to 0.5 nm.

4. A display device, comprising the thin film transistor according to claim 1.

5. The thin film transistor according to claim 2, wherein the second oxide semiconductor layer is formed on the gate insulating film; and the first oxide semiconductor layer is formed between the second oxide semiconductor layer and the etch stopper layer.

6. The thin film transistor according to claim 2, wherein a thickness of the second oxide semiconductor layer is larger than or equal to 0.5 nm.

7. A display device, comprising the thin film transistor according to claim 2.

8. The thin film transistor according to claim 1, wherein the second oxide semiconductor layer is formed on the gate insulating film; and the first oxide semiconductor layer is formed between the second oxide semiconductor layer and the etch stopper layer.

* * * * *